US012633527B2

(12) United States Patent
Zhao et al.

(10) Patent No.: US 12,633,527 B2
(45) Date of Patent: May 19, 2026

(54) SINGLE CRYSTAL MULTI-ELEMENT CATHODE MATERIAL, PREPARATION METHOD OF THE SAME, AND LITHIUM-ION BATTERY

(71) Applicant: BEIJING EASPRING MATERIAL TECHNOLOGY CO., LTD., Beijing (CN)

(72) Inventors: Xiangyu Zhao, Beijing (CN); Shunlin Song, Beijing (CN); Yanbin Chen, Beijing (CN); Tianmeng Zhao, Beijing (CN); Yafei Liu, Beijing (CN)

(73) Assignee: BEIJING EASPRING MATERIAL TECHNOLOGY CO., LTD., Beijing (CN)

( * ) Notice: Subject to any disclaimer, the term of this patent is extended or adjusted under 35 U.S.C. 154(b) by 42 days.

(21) Appl. No.: 18/932,656

(22) Filed: Oct. 31, 2024

(65) Prior Publication Data

US 2025/0059678 A1 Feb. 20, 2025

Related U.S. Application Data

(63) Continuation of application No. PCT/CN2022/144113, filed on Dec. 30, 2022.

(51) Int. Cl.
H01M 4/36 (2006.01)
C01G 53/05 (2025.01)
(Continued)

(52) U.S. Cl.
CPC ............ H01M 4/366 (2013.01); C01G 53/05 (2025.01); C01G 53/42 (2013.01); C01G 53/504 (2025.01);
(Continued)

(58) Field of Classification Search
CPC ...... C01G 53/05; C01G 53/42; C01G 53/504; C01G 53/506; C01G 53/84; C30B 1/02;
(Continued)

(56) References Cited

U.S. PATENT DOCUMENTS

| | | | |
|---|---|---|---|
| 2019/0006669 | A1 | 1/2019 | Park et al. |
| 2019/0372109 | A1 | 12/2019 | Moon et al. |
| 2022/0085378 | A1 | 3/2022 | Du et al. |

FOREIGN PATENT DOCUMENTS

| | | |
|---|---|---|
| CN | 112803010 A | 5/2021 |
| CN | 114703544 A | 7/2022 |
| WO | 2022207008 A1 | 10/2022 |

OTHER PUBLICATIONS

International Search Report dated Apr. 4, 2023 in International Application No. PCT/CN2022/144113. English translation attached.
(Continued)

*Primary Examiner* — Eugenia Wang

(57) ABSTRACT

Provided are a single crystal multi-element cathode material, a preparation method thereof, and a lithium-ion battery. The multi-element cathode material includes quasi single crystal particles each consisting of a plurality of crystal grains, and element G is present at grain boundaries between the plurality of crystal grains. A concentration of the element G at a g-site of the grain boundaries gradually decreases with an increase in a distance between the g-site and a surface of the quasi single crystal particles. The element G is selected from at least one of Ni, Co, Mn, Ta, Cr, Mo, W, La, Al, Y, Ti, Zr, V, Nb, Ce, Er, and B.

13 Claims, 2 Drawing Sheets

(51) Int. Cl.

| | |
|---|---|
| *C01G 53/42* | (2025.01) |
| *C01G 53/504* | (2025.01) |
| *C01G 53/506* | (2025.01) |
| *C01G 53/84* | (2025.01) |
| *C30B 1/02* | (2006.01) |
| *C30B 29/22* | (2006.01) |
| *H01M 4/525* | (2010.01) |
| *H01M 10/0525* | (2010.01) |

(52) U.S. Cl.
    CPC ........... *C01G 53/506* (2025.01); *C01G 53/84* (2025.01); *C30B 1/02* (2013.01); *C30B 29/22* (2013.01); *H01M 4/525* (2013.01); *H01M 10/0525* (2013.01); *C01P 2004/80* (2013.01)

(58) Field of Classification Search
    CPC .... C30B 29/22; C01P 2004/80; H01M 4/366; H01M 4/525; H01M 10/0525
    See application file for complete search history.

(56) References Cited

OTHER PUBLICATIONS

Kim Un Hyuck et al: "Compositionally and structurally redesigned high-energy Ni-rich layered cathode for next generation lithium batteries", Materials Today, vol. 23, Mar. 23, 2019 (Mar. 23, 2019), 26-36, XP085632429.
Extended European Search Report dated Jun. 10, 2025 received in corresponding European Application No. EP22918524.4.
Notice of Reasons for Refusal dated Apr. 1, 2025 received in corresponding patent family application No. JP2024564625. English translation attached.
Notice of Reasons for Refusal dated Jun. 17, 2025 received in corresponding patent family application No. JP2024564625. English translation attached.
First Office Action dated Jun. 24, 2025 received in corresponding patent family application No. EP22918524.4.
Decision to Grant dated Aug. 26, 2025 received in corresponding patent family application No. JP2024564625. English translation attached.
Written Opinion dated Apr. 4, 2023 in International Application No. PCT/CN2022/144113. English translation attached.

$$L = L_1 + L_2 + L_3 + L_4$$

$$L_g = L_3 + L_4$$

electronic image 1

SINGLE CRYSTAL MULTI-ELEMENT CATHODE MATERIAL, PREPARATION METHOD OF THE SAME, AND LITHIUM-ION BATTERY

CROSS-REFERENCE TO RELATED APPLICATIONS

This application is a continuation n of International Application No. PCT/CN2022/144113, filed on Dec. 30, 2022, which is incorporated herein by reference in its entirety.

FIELD

The present disclosure relates to the technical field of lithium-ion batteries, and more particularly, to a single crystal multi-element cathode material, a preparation method thereof, and a lithium-ion battery.

BACKGROUND

With a rapid development of a new energy industry, market has put forward higher requirements on performance of lithium-ion batteries. Cathode materials, as core materials with the greatest impact on the performance of the battery, are constantly being improved based on the goals of high energy density, long cycle life, high safety, and low cost. Multi-element materials such as lithium nickel cobalt manganese oxide (NCM) and lithium nickel cobalt aluminum oxide (NCA) have become the most widely used cathode materials due to their excellent energy density advantages. In order to achieve higher specific capacity, the content of Ni in the multi-element materials is continuously increased, leading to reduced material stability and subsequent deterioration in cycle life and safety performance. For this reason, the single crystal lithium nickel cobalt manganese oxide material with higher stability is increasingly widely used.

Single crystal multi-element materials may be divided into two states according to the growth arrangement of their crystals, i.e., pure single crystal state, in which each single crystal particle consists of an independent crystal particle, quasi single crystal state, which is formed by combining several crystal grains. Since pure single crystal particles do not have any internal pores and interfaces, paths for de-intercalation and intercalation of $Li^+$ ions are longer, and thus the material has a relatively poor capacity and rate capability. Therefore, current conventional commercial single crystal materials contain the aforementioned pure single crystal particles and quasi single crystal particles in different proportions. However, as stated in the article "Accelerated Degradation in a Quasi single crystal Layered Oxide Cathode for Lithium-Ion Batteries Caused by Residual Grain Boundaries", Zhang et al., *Nano Letters* in 2022, during a charge and discharge cycle of such quasi single crystal particles, due to changes in cell volume caused by the H2 to H3 phase transition, there are relatively concentrated isotropic stresses at the grain boundaries where different grains are connected to each other, resulting in interlayer slip, dislocations, and stacking faults at the grain boundaries, accelerating loss of active oxygen and irreversible phase changes, and causing a decrease in electrochemical capacity. Moreover, stress concentration may also cause cracks in particles along grain boundaries, generating new surfaces with high activity, further exacerbating side reactions between the material and the electrolyte, leading to problems such as reduced cycle life and increased impedance.

Common measures to improve the stability of materials include bulk phase doping, surface coating, etc. Existing technical means mainly aim at stabilizing the internal structure of the material crystals and the surface of the particles. However, there is no effective means to solve the problem of grain boundary degradation of the quasi single crystal particles.

SUMMARY

A first aspect of the present disclosure provides a single crystal multi-element cathode material. The multi-element cathode material includes quasi single crystal particles each consisting of a plurality of crystal grains, and element G is present at grain boundaries between the plurality of crystal grains. A concentration of the element G at a g-site of the grain boundaries gradually decreases with an increase in a distance between the g-site and a surface of the quasi single crystal particles. The element G is selected from at least one of Ni, Co, Mn, Ta, Cr, Mo, W, La, Al, Y, Ti, Zr, V, Nb, Ce, Er, and B.

A second aspect of the present disclosure provides a preparation method of a single crystal multi-element cathode material. The preparation method includes: mixing a matrix of the multi-element cathode material with a grain boundary stabilizer containing element G, and performing sintering treatment on the mixture, to obtain the single crystal multi-element cathode material. The element G is selected from at least one element of Ni, Co, Mn, Ta, Cr, Mo, W, La, Al, Y, Ti, Zr, V, Nb, Ce, Er, Mg, Sr, Ba, and B. D50 of the grain boundary stabilizer ranges from 0.01 μm to 10 μm, and D10, D50, and D90 of the grain boundary stabilizer satisfy: $K90=(D90-D10)/D50 \geq 1.5$.

A third aspect of the present disclosure provides a lithium-ion battery. The lithium-ion battery includes the above-mentioned single crystal multi-element cathode material.

According to the present disclosure, the single crystal multi-element cathode material is quasi single crystal particles each consisting of a plurality of crystal grains; the element G is present at the grain boundaries between the plurality of crystal grains; and the concentration of the element G at the g-site of the grain boundaries gradually decreases with the increase in the distance between the g-site and the surface of the quasi single crystal particles. The element G is fully infiltrated and filled within the grain boundaries of the cathode material, which can reduce a stress concentration of the cathode material produced at the grain boundaries due to changes of the cell volume during the charge and discharge cycle and improve the stability of the grain boundaries of the cathode material, allowing the cycle life of the lithium-ion battery containing the cathode material to be significantly prolonged. At the same time, with the improvement of the stability of the grain boundaries, less cracking of the grain boundaries can also reduce the generation of fresh internal interfaces, and under the conditions of multiple cycles and long-term storage, the impedance increase of the lithium-ion battery containing the cathode material is lower. Specifically, compared with the conventional cathode materials, a half-battery cycle capacity retention rate for 80 cycles at 1 C charge and discharge under 45° C. of a lithium-ion battery containing the cathode material according to the present disclosure can be improved by at least 4%; and the impedance increase rate can be reduced by at least 15%.

Further, in the single crystal multi-element cathode material according to the present disclosure, the element G is filled in a gradient at the grain boundaries as a conductive medium, which is more conducive to an outward diffusion of $Li^+$ in the depth of the grain boundaries. Therefore, when the cathode material is used in the lithium-ion batteries, the capacity of the cathode material can be fully utilized, and the rate capability of the cathode material is better. Specifically, compared with the conventional cathode materials, in a voltage range between 3.0V to 4.3V, 0.1C discharge capacity at 25° C. of the lithium-ion battery containing the cathode material according to the present disclosure can be increased by more than 1 mAh/g; and 1 C rate discharge can be increased by more than 2%.

The preparation method of the single crystal multi-element cathode material according to the present disclosure has a simple and controllable process, which is suitable for industrial production.

DETAILED DESCRIPTION

Figure 1:
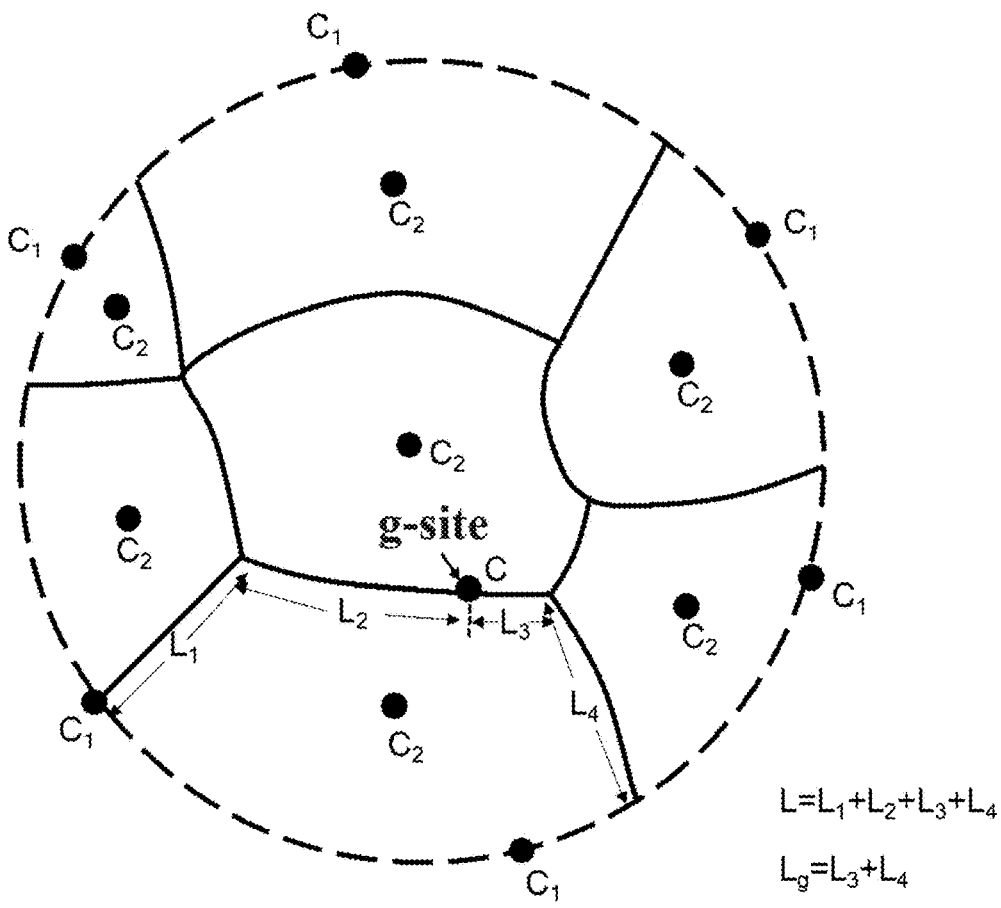
FIG. 1 is a schematic view of a quasi single crystal particle of a single crystal multi-element cathode material according to the present disclosure.

The endpoints and any value of the ranges disclosed herein shall not limited to the exact range or value, and those ranges or values should be understood to include values close to those ranges or values. For numerical ranges, endpoints of each range, an endpoint of each range and an individual point value, and individual point values may be combined with each other to obtain one or more new numerical ranges, which should be deemed to be specifically disclosed herein.

In order to overcome the problems in the prior art that electrochemical performances of batteries such as capacity and rate capability deteriorate due to the poor stability of grain boundaries of quasi single crystal cathode material particles, an object of the present disclosure is to provide a single crystal multi-element cathode material, a preparation method thereof, and a lithium-ion battery. The single crystal multi-element cathode material includes quasi single crystal particles each consisting of a plurality of crystal grains. Element G is present at grain boundaries between the plurality of crystal grains. A concentration of the element G at a g-site of the grain boundaries gradually decreases with an increase in a distance between the g-site and a surface of the quasi single crystal particles. As a result, erosion of an electrolyte on the grain boundaries can be significantly slowed down, and the stability of the grain boundaries of the cathode material can be improved, thereby significantly improving the cycle life, energy density, rate capability, and impedance increase rate of the lithium-ion battery containing the cathode material.

In a first aspect, the present disclosure provides a single crystal multi-element cathode material. The multi-element cathode material includes quasi single crystal particles each consisting of a plurality of crystal grains. Element G is present at grain boundaries between the plurality of crystal grains. A concentration of the element G at a g-site of the grain boundaries gradually decreases with an increase in a distance between the g-site and a surface of the quasi single crystal particles. The element G is selected from at least one of Ni, Co, Mn, Ta, Cr, Mo, W, La, Al, Y, Ti, Zr, V, Nb, Ce, Er, and B.

In the present disclosure, the grain boundary refers to a contact interface and/or gap between crystal grains constituting the quasi single crystal particle. In the present disclosure, since the single crystal multi-element cathode material is obtained by common development and growth of a large number of crystal nuclei, most of the crystal grains may fuse with each other during a growth process of crystal. When the crystal grows to a certain size, i.e., when the single crystal multi-element cathode material described in the present disclosure is formed, some crystal grains, which are not fully fused, have different orientations, and their interface is the grain boundary described in the present disclosure.

In the present disclosure, the single crystal multi-element cathode material includes quasi single crystal particles each consisting of the plurality of crystal grains. The element G is present at grain boundaries between the plurality of crystal grains. The concentration of the element G at the g-site of the grain boundaries gradually decreases with the increase in the distance between the g-site and the surface of the quasi single crystal particles. The element G is fully infiltrated and filled within the grain boundaries of the cathode material, which can reduce a stress concentration of the cathode material produced at the grain boundaries due to changes of the cell volume during a charge and discharge cycle and improve the stability of the grain boundaries of the cathode material, allowing the cycle life of the lithium-ion battery containing the cathode material to be significantly prolonged. At the same time, with the improvement of the stability of the grain boundaries, less cracking of the grain boundaries can also reduce the generation of fresh internal interfaces, and under the conditions of multiple cycles and long-term storage, the impedance increase of the lithium-ion battery containing the cathode material is lower. Specifically, compared with the conventional cathode materials, a half-battery cycle capacity retention rate for 80 cycles at 1 C charge and discharge under 45° C. of a lithium-ion battery containing the cathode material according to the present disclosure can be improved by at least 4%; and the impedance increase rate can be reduced by at least 15%.

Further, in the single crystal multi-element cathode material according to the present disclosure, the element G is filled in a gradient at the grain boundaries as a conductive medium, which is more conducive to an outward diffusion of Li in the depth of the grain boundaries. Therefore, when the cathode material is used in the lithium-ion batteries, the capacity of the cathode material can be fully utilized, and the rate capability of the cathode material is better. Specifically, compared with the conventional cathode materials, in a voltage range between 3.0V to 4.3V, 0.1 C discharge capacity at 25° C. of the lithium-ion battery containing the cathode material according to the present disclosure can be increased by more than 1 mAh/g; and 1 C rate discharge can be increased by more than 2%.

Further, the element G is selected from at least one of Mn, Co, W, La, Al, Ti, Zr, and Nb.

According to the present disclosure, in a scanning electron microscope (SEM) image of a cross-section sample of the quasi single crystal particles, the concentration of the element G at the g-site of the grain boundaries satisfies the following relationship:

$$1.2C_1 \geq C_g \geq 0.8C_2, \text{ and} \qquad \text{Formula I,}$$

$$k = C_g / \left( C_2 + \frac{L/2 - L_g}{L/2}(C_1 - C_2) \right), \qquad \text{Formula II,}$$

where $C_1$ is a concentration of the element G on the surface of the quasi single crystal particles, mol %; $C_2$ is a concentration of the element G in bulk phase of the quasi single crystal particles, mol %; $C_g$ is the concentration of the element G at the g-site of the grain boundaries, mol %; L is a total length of the grain boundary passing through the g-site, μm; $L_g$ is a length of the shortest path from the g-site to the surface of the quasi single crystal particles along the grain boundary, μm; and k is a coefficient, k ranging from 0.8 to 1.2.

In the present disclosure, L is the total length of the grain boundary passing through the g-site, which refers to a sum of approximate lengths of the two shortest grain boundary sections extending from the g-site, as the starting point, to the surface of the quasi single crystal particle in two opposite directions parallel to the crystal plane. $L_g$ refers to the approximate length of the shortest grain boundary route extending from the g-site, as the starting point, to the surface of the quasi single crystal particle in a direction parallel to the grain boundary.

In the present disclosure, L and $L_g$ are both approximate values, as the grain boundary is not linear and cannot be actually measured. Therefore, multiple straight lines are drawn along the direction of the grain boundary for simulation, and the length of the straight line is used to approximately replace the actual length of the grain boundary.

In the present disclosure, $C_1$, $C_2$, and $C_g$ are measured by a scanning electron microscope energy spectrum analysis: the single crystal multi-element cathode material is prepared into a cross-section sample by an ion grinding method; quasi single crystal single crystal particles in the cross-section sample are selected by a scanning electron microscope energy spectrum analyzer; and energy spectrum analysis site tests are performed at different sites on the grain boundaries of the particles to obtain an atomic percentage of the element at the site, and at least 5 groups of data are tested at each position to take an average value.

In the present disclosure, in order to reflect a variation trend of the concentration of the element G, a plurality of different sites along the grain boundary are randomly selected for testing and evaluation, and the selected sites should be relatively dispersed to avoid being excessively concentrated.

Due to the limitations of the stability of the detection method, there may be individual abnormal data that exceed the calculation results of Formula II, which should be eliminated during evaluation. When more than 75% of the data conform to the rule that the concentration of the element G at the g-site of the grain boundaries gradually decreases with the increase in the distance between the g-site and the surface of the quasi single crystal particles as described in the present disclosure, it should be regarded as having the technical effects and requirements of the present disclosure.

Further, $1.1 \ C_1 \geq C_g \geq 0.9 \ C_2$.

According to the present disclosure, the total length L of the grain boundaries obtained by scanning electron microscope energy spectrum analysis satisfies $0.01 \ \mu m \leq L \leq 8 \ \mu m$.

According to the present disclosure, $C_1 - C_2 \geq 0.1\%$.

Further, $C_1 - C_2 \geq 0.2\%$.

According to the present disclosure, when $C_1 > 5\%$, k ranges from 0.9 to 1.1; and when $C_1 \leq 5\%$, k ranges from 0.8 to 1.2.

FIG. 1 is a schematic view of the quasi single crystal particles of the single crystal multi-element cathode material according to the present disclosure. As shown in FIG. 1, the cathode material of the present disclosure includes quasi single crystal particles each consisting of a plurality of crystal grains. The contact surface between each crystal grains is the grain boundary of the present disclosure. Taking the g-site in the figure as an example, the total length L of the grain boundary passing through the g-site along the grain boundary to the surface of the quasi single crystal particle includes two parts: one part is $L_1$ and $L_2$ directions, and the other part is $L_3$ and $L_4$ directions. The value of the total length L can be obtained by $L_1 + L_2 + L_3 + L_4$. The shortest path $L_g$ from the g-site along the grain boundary to the surface of the quasi single crystal particles may be obtained by $L_3 + L_4$. The concentration $C_1$ of the element G on the surface of the quasi single crystal particles is obtained by taking the average value of the test values at different positions on the surface. The concentration $C_2$ of the element G in the bulk phase of the quasi single crystal particles is obtained by taking the average value of the test values at the central position inside different crystal grains.

According to the present disclosure, the quasi single crystal particles have each a long diameter $D_1$ satisfying $0.1 \ \mu m \leq D_1 \leq 20 \ \mu m$ and a short diameter $D_2$ satisfying $0.1 \ \mu m \leq D_2 \leq 20 \ \mu m$.

According to the present disclosure, the crystal grains have each a long diameter $D_3$ satisfying $0.1 \ \mu m \leq D_3 \leq 12 \ \mu m$ and a short diameter $D_4$ satisfying $0.1 \ \mu m \leq D_4 \leq 12 \ \mu m$.

According to the present disclosure, the grain boundaries have each a width ranging from 1 nm to 50 nm, and a difference between the maximum width of the grain boundaries and the minimum width of the grain boundaries is smaller than or equal to 20 nm.

In the present disclosure, the width of the grain boundary refers to a distance between the surfaces of adjacent grains on both sides of the grain boundary along a direction perpendicular to the surface of the material. The width of the grain boundary is measured by a scanning electron microscope method. When the difference between the maximum width of the grain boundary and the minimum width of the grain boundary is greater than 20 nm, the concentration of the element G at a site of the grain boundary with such a great width relatively increases, and Formula II is not applicable to the concentration of the element G at this site.

In the present disclosure, the addition of the grain boundary stabilizer does not change the total length L of the grain boundaries, the long diameter $D_1$ of the quasi single crystal particles, the short diameter $D_2$ of the quasi single crystal particles, the long diameter $D_3$ of the crystal grains, the short diameter $D_4$ of the crystal grains, the width (H) of the grain boundary, and the difference between the maximum width ($H_{max}$) and minimum width ($H_{min}$) of the grain boundaries in the multi-element cathode material. The total length L of the grain boundaries, the long diameter $D_1$ of the quasi single crystal particles, the short diameter $D_2$ of the quasi single crystal particles, the long diameter $D_3$ of the crystal grains, the short diameter $D_4$ of the crystal grains, the width (H) of the grain boundary, and the difference between the maximum width ($H_{max}$) and minimum width ($H_{min}$) of the grain boundaries in the single crystal multi-element cathode material are the same as those of the multi-element cathode matrix material before mixing and sintering with the grain boundary stabilizer.

In the present disclosure, in the multi-element cathode material, the total length L of the grain boundaries, the long diameter $D_1$ of the quasi single crystal particles, the short diameter $D_2$ of the quasi single crystal particles, the long diameter $D_3$ of the crystal grains, the short diameter $D_4$ of the crystal grains, the width (H) of the grain boundary, and the difference between the maximum width ($H_{max}$) and minimum width ($H_{min}$) of the grain boundaries are measured by SEM. Specifically, these values are obtained by taking an average value of randomly selected 300 quasi single crystal particles samples of the multi-element cathode material in the SEM image of the multi-element cathode material.

According to the present disclosure, the single crystal multi-element cathode material includes a matrix and a coating layer coated on the matrix. The matrix has a composition represented by Formula III:

$$Li_{1+a}(Ni_xCo_yMe_zM_w)O_2, \qquad \text{Formula III,}$$

where: $-0.1{\leq}a{\leq}0.1$, $0{<}x{<}1$, $0{<}y{\leq}0.4$, $0{<}z{\leq}0.6$, $0{\leq}w{\leq}0.2$; Me is selected from Mn and/or Al; and M is at least one element of Ta, Cr, Mo, W, La, Al, Y, Ti, Zr, V, Nb, Ce, Er, Mg, Sr, and Ba;

the coating layer is selected from a lithium oxide compound of the element G and/or oxide of the element G;

the element G is at least one element of Ni, Co, Mn, Ta, Cr, Mo, W, La, Al, Y, Ti, Zr, V, Nb, Ce, Er, and B; and a molar ratio of the coating layer, based on n(G), to the matrix, based on [n(Ni)+n(Co)+n(Me)+n(M)], ranges from 0.001 to 0.05.

Further, $-0.06{\leq}a{\leq}0.06$, $0.4{<}x{<}1$, $0{<}y{\leq}0.3$, $0{<}z{\leq}0.5$, and $0{<}w{\leq}0.1$.

Further, Me is selected from Mn and/or Al.

Further, M is at least one element of W, La, Al, Y, Ti, Zr, Nb, Ce, Mg, and Sr.

Further, the element G is at least one element of Mn, Co, W, La, Al, Ti, Zr, and Nb.

Further, the molar ratio of the coating layer, based on n(G), to the matrix, based on [n(Ni)+n(Co)+n(Me)+n(M)], ranges from 0.005 to 0.04.

A second aspect of the present disclosure provides a preparation method of a single crystal multi-element cathode material. The preparation method includes: mixing a matrix of the multi-element cathode material with a grain boundary stabilizer containing element G, and performing sintering treatment on the mixture, to obtain the single crystal multi-element cathode material. The element G is selected from at least one of Ni, Co, Mn, Ta, Cr, Mo, W, La, Al, Y, Ti, Zr, V, Nb, Ce, Er, and B. D50 of the grain boundary stabilizer ranges from 0.01 μm to 10 μm, and D10, D50, and D90 of the grain boundary stabilizer satisfy: K90–(D90–D10)/D50≥1.5.

In the present disclosure, the matrix of the multi-element cathode material is mixed with a grain boundary stabilizer containing the element G and having a specific particle size and particle size distribution, and then sintered to obtain the single crystal multi-element cathode material as described in the first aspect of the present disclosure. Specifically, the cathode material includes the quasi single crystal particles each consisting of the plurality of crystal grains, and element G is present at grain boundaries between the plurality of crystal grains. The concentration of the element G at the g-site of the grain boundaries gradually decreases with the increase in the distance between the g-site and the surface of the quasi single crystal particles. The element G is fully infiltrated and filled within the grain boundaries of the cathode material, which can reduce a stress concentration of the cathode material produced at the grain boundaries due to changes of the cell volume during the charge and discharge cycle and improve the stability of the grain boundaries of the cathode material, allowing the cycle life of the lithium-ion battery containing the cathode material to be significantly prolonged. At the same time, with the improvement of the stability of the grain boundaries, less cracking of the grain boundaries can also reduce the generation of fresh internal interfaces, and under the conditions of multiple cycles and long-term storage, the impedance increase of the lithium-ion battery containing the cathode material is lower.

In particular, the preparation method of the single crystal multi-element cathode material according to the present disclosure has a simple process and an easily controllable process, suitable for industrial production.

Further, the element G is selected from at least one of Mn, Co, W, La, Al, Ti, Zr, and Nb.

Further, the grain boundary stabilizer is selected from at least one of oxide, oxyhydroxide, hydroxide, fluoride, sulfate, nitrate, carbonate, and oxalate containing the element G.

Further, D50 of the grain boundary stabilizer ranges from 0.1 μm to 8 μm, and D10, D50, and D90 of the grain boundary stabilizer satisfy K90=(D90–D10)/D50≥2.

According to the present disclosure, the grain boundary stabilizer has a specific surface area of greater than or equal to 10 $m^2$/g.

In the present disclosure, an interface stabilizer with a relatively great specific surface area is used, which is beneficial to uniform dispersion with the material during the mixing process with the material. In addition, the interface stabilizer with the relatively great specific surface area can have a higher reaction activity, which is beneficial to diffusion into the grain boundary during the sintering process, allowing the interface stabilizer to achieve a better gradient filling effect at the grain boundaries.

Further, the grain boundary stabilizer has a specific surface area ranging from 20 $m^2$/g to 100 $m^2$/g.

According to the present disclosure, the grain boundary stabilizer is added in an amount according to a stoichiometric ratio of 0.001≤n(G)/[n(Ni)+n(Co)+n(Me)+n(M)]≤0.05.

In the present disclosure, when the addition amount of the grain boundary stabilizer is excessively low, that is, n(G)/[n(Ni)+n(Co)+n(Me)+n(M)] is smaller than 0.001, the proportion of added element G is excessively low, and the gradient effect cannot be achieved. When the addition amount of the grain boundary stabilizer is excessively high, that is, n(G)/[n(Ni)+n(Co)+n(Me)+n(M)] is greater than 0.05, the element G will be excessively accumulated on the surface of the particles, thereby inhibiting the electrochemical activity of the multi-element cathode material. Moreover, the excessive element G may consume more active $Li^+$, thereby reducing the capacity of the battery containing the multi-electrode positive material. When the addition amount of the grain boundary stabilizer is controlled to meet the above-mentioned range, an optimal concentration gradient change of the element G of the grain boundary can be achieved, thereby achieving the technical effect of the present disclosure.

Further, the grain boundary stabilizer is added in an amount according to a stoichiometric ratio of $0.005 \leq n(G)/[n(Ni)+n(Co)+n(Me)+n(M)] \leq 0.04$.

In the present disclosure, when the single crystal multi-element cathode material is prepared by mixing two or more grain boundary stabilizers with the matrix of the multi-element cathode material, the respective addition amount of the two or more grain boundary stabilizers is not specifically limited, as long as the total addition amount of the grain boundary stabilizers added meets the above-mentioned range.

According to the present disclosure, conditions for said mixing include: mixing in a device including a stirring paddle, the stirring paddle having a linear speed at the end of paddle of greater than or equal to 20 m/s.

In the present disclosure, by mixing under the above-mentioned conditions, high mixing strength can be provided to ensure that the grain boundary stabilizer and the multi-element cathode material are fully and evenly mixed, while the high mixing strength has a certain grinding effect on the grain boundary stabilizer, prompting the tiny powders therein to gather at the grain boundaries on the surface of the quasi single crystal particles, and allowing the powders to infiltrate and fill into the grain boundaries during the sintering process more easily.

In the present disclosure, the device containing the stirring paddle is not specifically limited, as long as it contains a stirring paddle. For example, it may be a stirring paddle rotary mixing device, such as a plowshare mixer, a high-speed mixer, a mechanical fusion machine, and the like.

In the present disclosure, the linear speed at the end of paddle v=diameter of the paddle×π×rotate speed.

Further, the conditions for said mixing include: mixing in a device including a stirring paddle having a linear speed at the end of paddle ranging from 30 m/s to 50 m/s.

According to the present disclosure, conditions for the sintering treatment include a sintering temperature of 400° C. or higher and a sintering duration of 4 hours or more.

In the present disclosure, by sintering under the above-mentioned conditions, effective diffusion and reaction of the grain boundary stabilizer can be achieved, and ensure that the grain boundary stabilizer deeply enters into the grain boundary and forms a gradient filling effect. When the temperature is excessively low or the time is excessively short, the grain boundary stabilizer cannot fully react, and the technical effect of the present disclosure cannot be achieved. When the temperature is excessively high or the time is excessively long, the multi-element material may be changed in the crystal structure, which leads to a loss of the performance of the cathode material.

Further, the conditions for the sintering treatment include a sintering temperature ranging from 600° C. to 900° C. and a sintering duration ranging from 6 hours to 10 hours.

In the present disclosure, the type of the multi-element cathode material is not specifically limited, which may be a conventional multi-element cathode material in the art, preferably a lithium nickel cobalt manganese oxide cathode material and/or a lithium nickel cobalt aluminum oxide cathode material.

In one specific embodiment of the present disclosure, the matrix of the multi-element cathode material has a composition represented by Formula IV:

$$Li_{1+a}(Ni_xCo_yMe_zM_w)O_2, \hspace{2cm} \text{Formula IV,}$$

where $-0.1 \leq a \leq 0.1$, $0<x<1$, $0<y \leq 0.4$, $0<z \leq 0.6$, $0 \leq w \leq 0.2$; Me is selected from Mn and/or Al; and M is at least one of Ta, Cr, Mo, W, La, Al, Y, Ti, Zr, V, Nb, Ce, Er, Mg, Sr, and Ba.

Further, $-0.06 \leq a \leq 0.06$, $0.4<x<1$, $0<y \leq 0.3$, $0<z \leq 0.5$, and $0<w \leq 0.1$.

Further, Me is selected from Mn and/or Al.

Further, M is at least one of W, La, Al, Y, Ti, Zr, Nb, Ce, Mg, and Sr.

In the present disclosure, the source of the matrix of the multi-element cathode material is not specifically limited, which may be purchased from the market or prepared in-house. The preparation method of the multi-element cathode material is not specifically limited, and the multi-element cathode material may be prepared by a conventional preparation method in the art.

In one specific embodiment of the present disclosure, the matrix of the multi-element cathode material is prepared according to the following steps: mixing a precursor of the cathode material, a lithium source, and a dopant, and performing a heat treatment on the mixture, to obtain the multi-element cathode material.

In the present disclosure, the precursor of the cathode material has a composition represented by Formula V:

$$Ni_xCo_yMe_z(OH)_2, \hspace{2cm} \text{Formula V,}$$

where: $0<x<1$, $0<y \leq 0.4$, and $0<z \leq 0.6$; and Me is selected from Mn and/or Al.

In the present disclosure, the lithium source may be a conventional lithium source in the art, such as $Li_2CO_3$ and/or LiOH.

In the present disclosure, the dopant is a compound containing M, and M is selected from at least one element of Ta, Cr, Mo, W, La, Al, Y, Ti, Zr, V, Nb, Ce, Er, Mg, Sr, and Ba.

In the present disclosure, an addition amount of the lithium source and an addition amount of the precursor of the cathode material satisfy $0.9 \leq n(Li)/[n(Ni)+n(Co)+n(Me)+n(M)] \leq 1.1$, and preferably, $0.94 \leq n(Li)/[n(Ni)+n(Co)+n(Me)+n(M)] \leq 1.06$.

In the present disclosure, an addition amount of the dopant and an addition amount of the precursor of the cathode material satisfy $0 \leq n(M)/[n(Ni)+n(Co)+n(Me)+n(M)] \leq 0.2$, and preferably, $0 \leq n(M)/[n(Ni)+n(Co)+n(Me)+n(M)] \leq 0.1$.

In the present disclosure, the dopant may miscible with Ni, Co, and Me in the precursor of the cathode material. As a result, in the prepared cathode material, $n(Ni)+n(Co)+n(Me)+n(M)=1$. When the addition amount of the dopant is relatively low, the content of the dopant cannot be accurately measured by existing detection methods. In this case, the doping element M has insignificant effect on the proportion of Ni, Co, and Me, allowing $n(Ni)+n(Co)+n(Me)+n(M)$ in the expressional formula to be slightly greater than 1.

In the present disclosure, conditions for the heat treatment include a heat treatment temperature ranging from 850° C. to 950° C. and a heat treatment duration ranging from 8 hours to 10 hours.

A third aspect of the present disclosure provides a single crystal multi-element cathode material, prepared by the above-mentioned preparation method.

A fourth aspect of the present disclosure provides a lithium-ion battery. The lithium-ion battery includes the above-mentioned single crystal multi-element cathode material.

The present disclosure will be described in detail below by means of examples.

In the following examples, the composition of the single crystal multi-element cathode material was measured using an inductively coupled plasma spectroscopy; the concentration of element G in the single crystal multi-element cathode material was measured by a scanning electron microscope energy spectrum analysis method; the length and width of the grain boundaries, long diameter, and short diameter of the quasi single crystal particles in the single crystal multi-element cathode material were measured by a scanning electron microscopy; the long diameter and short diameter of the crystal grains in the single crystal multi-element cathode material were measured using a scanning electron microscope; the D10, D50, and D90 of the grain boundary stabilizer were measured using a laser diffraction method GB/T19077-2016; the specific surface area of the grain boundary stabilizer was measured using a BET method GB-T19587-2017; and the cycle life, energy density, and rate capability of lithium-ion batteries were tested using a 2025-type button battery.

The preparation process of the 2025-type button battery was as follows:

Preparation of electrode plate: a multi-element cathode material, acetylene black, and polyvinylidene fluoride (PVDF), according to a mass ratio of 95:3:2, were mixed with an appropriate amount of N-methylpyrrolidone (NMP) to form a uniform slurry. The slurry was coated on an aluminum foil and dried at 120° C. for 12 hours. Then, the slurry was stamped with a pressure of 100 MPa into a positive electrode plate with a diameter of 12 mm and a thickness of 120 μm. The multi-element cathode material had a loading amount ranging from 15 $mg/cm^2$ to 16 $mg/cm^2$.

Assembly of battery: in an argon-filled glove box with a water content and an oxygen content of smaller than 5 ppm, the positive electrode plate, a separator, a negative electrode plate, and electrolyte were assembled to a 2025-type button battery, and the assembled battery was left to stand for 6 hours. A metal lithium plate with a diameter of 17 mm and a thickness of 1 mm was used as the negative electrode plate. A polyethylene porous membrane (Celgard 2325) with a thickness of 25 μm was used as the separator. A mixture of equivalent amounts of 1 mol/L $LiPF_6$, ethylene carbonate (EC), and diethyl carbonate (DEC) was used as the electrolyte.

Electrochemical performance test: in the following examples and comparative examples, the electrochemical performances of the 2025-type button battery were tested using a Neware battery testing system (NEWARE TECHNOLOGY LIMITED, Shenzhen), and the charge and discharge current density at 0.1 C was 200 mA/g.

The charge and discharge voltage range was controlled to range from 3.0V to 4.3V. At room temperature, the button battery was subjected to a charge and discharge test at 0.1 C to evaluate a first discharge specific capacity of the multi-element cathode material.

Cycle performance test: the charge and discharge voltage range was controlled to range from 3.0V to 4.3V; at a constant temperature of 45° C., the button battery was charged and discharged for 2 cycles at 0.1 C, and then charged and discharge for 80 cycles at 1 C to evaluate a high-temperature capacity retention rate of the multi-element cathode material.

Rate capability test: the charge and discharge voltage range was controlled to range from 3.0V to 4.3V. At room temperature, the button battery was charged and discharged for 2 cycles at 0.1C, and then charged and discharged once at 0.2 C, 0.33 C, 0.5 C, and 1 C, respectively. A ratio of the first discharge specific capacity at 0.1 C to the discharge specific capacity at 1 C was used to evaluate the rate capability of the multi-element cathode material.

The first discharge specific capacity at 0.1 C was the discharge specific capacity of the button battery in the first cycle, and the discharge specific capacity at 1 C was the discharge specific capacity of the button battery in the sixth cycle.

Impedance increase rate test: the charge and discharge voltage range was controlled to range from 3.0V to 4.3V. The button battery was fixed at 0.1 C at room temperature, and HPPC-DCR at 50% SOC was tested, recorded as an initial impedance R1. At a constant temperature of 45° C., the button battery was charged and discharged twice at 0.1 C, and then charged and discharged for 80 cycles at 1 C. The button battery after the cycle was fixed at 0.1 C at room temperature, and the HPPC-DCR at 50% SOC was tested, recorded as a post-cycle impedance R2. The impedance increase rate of the material was calculated by the formula of $(R2-R1)/R1 \times 100\%$.

Preparation Examples

The Preparation Examples are provided to explain a preparation method of a multi-element cathode material.

Preparation Example 1

A precursor of $Ni_{0.6}Co_{0.2}Mn_{0.2}(OH)_2$, a lithium source of $Li_2CO_3$ and LiOH, and a dopant containing Al compound were mixed according to a molar ratio of $n(Li)/[n(Ni)+n(Co)+n(Mn)+n(Al)]=1.05$ and $n(Al)/[n(Ni)+n(Co)+n(Mn)+n(Al)]=0.1$, and then the mixture was subjected to a heat treatment at 900° C. for 10 hours to prepare a multi-element cathode material P1, having a composition of $Li_{1.05}Ni_{0.54}Co_{0.18}Mn_{0.18}Al_{0.1}O_2$.

Preparation Example 2

A precursor of $Ni_{0.8}Co_{0.1}Mn_{0.1}(OH)_2$, a lithium source of LiOH, and a dopant containing Zr compound were mixed according to a molar ratio of $n(Li)/[n(Ni)+n(Co)+n(Mn)+n(Zr)]=1.05$ and $(n(Zr)/[n(Ni)+n(Co)+n(Mn)+n(Zr)]=0.002$, and then the mixture was subjected to a heat treatment at 850° C. for 10 hours to prepare a multi-element cathode material P2, having a composition of $Li_{1.05}Ni_{0.8}Co_{0.1}Mn_{0.1}Zr_{0.002}O_2$.

Preparation Example 3

A precursor of $Ni_{0.96}Co_{0.02}Al_{0.02}(OH)_2$, a lithium source of LiOH, and a dopant containing Ti compound were mixed according to a molar ratio of $n(Li)/[n(Ni)+n(Co)+n(Al)+n(Ti)]=1.03$ and $n(Ti)/[n(Ni)+n(Co)+n(Al)+n(Ti)]=0.001$, and then the mixture was subjected to a heat treatment at 800° C. for 10 hours to prepare a multi-element cathode material P3, having a composition of $Li_{1.03}Ni_{0.96}Co_{0.02}Al_{0.02}Ti_{0.001}O_2$.

Preparation Example 4

A precursor of $Ni_{0.6}Co_{0.2}Mn_{0.2}(OH)_2$, a lithium source of $Li_2CO_3$ and LiOH were mixed according to a molar ratio of $n(Li)/[n(Ni)+n(Co)+n(Mn)]=1.05$, and then the mixture was subjected to a heat treatment at 900° C. for 10 hours to prepare a multi-element cathode material P4, having a composition of $Li_{1.05}Ni_{0.6}Co_{0.2}Mn_{0.2}O_2$.

For the multi-element cathode materials prepared in the preparation examples, a total length L, a width (H), a difference between the maximum width ($H_{max}$) and the minimum width ($H_{min}$) of grain boundaries, a long diameter $D_1$ and short diameter $D_2$ of quasi single crystal particles, and a long diameter $D_3$ and short diameter $D_4$ of crystal grains of were tested, and the results were shown in Table 1.

TABLE 1

| | L | H | $H_{max}-H_{min}$ | $D_1$ | $D_2$ | $D_3$ | $D_4$ |
|---|---|---|---|---|---|---|---|
| Preparation Example 1 | 4.7 | 23 | 4 | 6.2 | 4.6 | 2.6 | 1.8 |
| Preparation Example 2 | 3.5 | 19 | 6 | 4.5 | 4.1 | 1.7 | 1.3 |
| Preparation Example 3 | 3.2 | 20 | 4 | 3.7 | 3.4 | 1.6 | 1 |
| Preparation Example 4 | 4.5 | 22 | 5 | 5.3 | 5.1 | 2.3 | 2 |

Example 1

(1) The multi-element cathode material P1 was mixed with cobalt hydroxide powder to obtain a mixed material, using a high-speed mixer with a linear speed of 35 m/s at the end of a stirring paddle as a mixing device. The multi-element cathode material and cobalt hydroxide were added according to a stoichiometric ratio of $n(Co)/[n(Ni)+n(Co)+n(Mn)+n(Al)]=0.025$. The cobalt hydroxide powder contained both nano-scale and submicron-scale particles, and had D50 of 0.5 μm, K90 of 2.3, and a specific surface area of 20 m²/g.

(2) The mixed material was subjected to a sintering treatment at 750° C. in an oxygen atmosphere for 6 hours, to obtain a single crystal multi-element cathode material A1, including a matrix and a coating layer coated on the matrix. The matrix had a composition of $Li_{1.05}Ni_{0.54}Co_{0.18}Mn_{0.18}Al_{0.1}O_2$. The coating layer was mainly composed of lithium cobalt oxide, and also contained a small amount of cobalt oxide. A molar ratio of coating layer, based on n(G), to the matrix, based on [n(Ni)+n(Co)+n(Me)+n(M)], was 0.025.

Example 2

(1) The multi-element cathode material P1 was mixed with tungsten oxide powder to obtain a mixed material, using a high-speed mixer with a linear speed of 35 m/s at the end of a stirring paddle as a mixing device. The multi-element cathode material P1 and tungsten oxide were added according a to stoichiometric ratio of $n(W)/[n(Ni)+n(Co)+n(Mn)+n(Al)]=0.025$. The tungsten oxide powder contained both nano-scale and submicron-scale particles, and had D50 of 4 μm, K90 of 3.4, and a specific surface area of 14 m²/g.

(2) The mixed material was subjected to a sintering treatment at 750° C. in an oxygen atmosphere for 6 hours, to obtain a single crystal multi-element cathode material A2, including a matrix and a coating layer coated on the matrix. The matrix had a composition of $Li_{1.05}Ni_{0.54}Co_{0.18}Mn_{0.18}Al_{0.1}O_2$. The coating layer was mainly composed of lithium tungsten oxide, and also contained a small amount of tungsten oxide. A molar ratio of the coating layer, based on n(W), to the matrix, based on [n(Ni)+n(Co)+n(Mn)+n(Al)], was 0.025.

Example 3

(1) The multi-element cathode material P1 was mixed with titanium boride powder to obtain a mixed material, using a high-speed mixer with a linear speed of 35 m/s at the end of a stirring paddle as a mixing device. The cathode material and titanium boride were added according to a stoichiometric ratio of $n(Ti)/[n(Ni)+n(Co)+n(Mn)+n(Al)]=0.025$. The titanium boride powder contained both nano-scale and submicron-scale particles, and had D50 of 1 μm, K90 of 5.6, and a specific surface area of 45 m²/g.

(2) The mixed material was subjected to a sintering treatment at 750° C. in an oxygen atmosphere for 6 hours, to obtain a single crystal multi-element cathode material A3, including a matrix and a coating layer coated on the matrix. The matrix had a composition of $Li_{1.05}Ni_{0.54}Co_{0.18}Mn_{0.18}Al_{0.1}O_2$. The coating layer was mainly composed of lithium titanium oxide, and also contained a small amount of titanium oxide. A molar ratio of the coating layer, based on n(Ti), to the matrix, based on [n(Ni)+n(Co)+n(Mn)+n(Al)], was 0.025.

Example 4

(1) The multi-element cathode material P1 was mixed with aluminum oxide powder to obtain a mixed material. A mixing device used a high-speed mixer with a linear speed of 35 m/s at the end of a stirring paddle. The cathode material and aluminum oxide were added according to a stoichiometric ratio of $n(Al)/[n(Ni)+n(Co)+n(Mn)+n(Al)]=0.025$. The aluminum oxide powder contained both nano-scale and submicron-scale particles, and had D50 of 3.8 μm, K90 of 2, and a specific surface area of 78 m²/g.

(2) The mixed material was subjected to a sintering treatment at 750° C. in an oxygen atmosphere for 6 hours, to obtain a single crystal multi-element cathode material A4, including a matrix and a coating layer coated on the matrix. The matrix had a composition of $Li_{1.05}Ni_{0.54}Co_{0.18}Mn_{0.18}Al_{0.1}O_2$. The coating layer was mainly composed of lithium aluminum oxide, and also contained a small amount of aluminum oxide. A molar ratio of the coating layer, based on n(Al), to the matrix, based on [n(Ni)+n(Co)+n(Mn)+n(Al)], was 0.025.

Example 5

(1) The multi-element cathode material P1 was mixed with aluminum oxide powder and zirconium oxide powder to obtain a mixed material. A mixing device used a high-speed mixer with a linear speed of 35 m/s at the end of a stirring paddle. Aluminum oxide was added according to a stoichiometric ratio of $n(Al)/[n(Ni)+n(Co)+n(Mn)+n(Al)]=0.025$, and zirconium oxide was added according to a stoichiometric ratio of $n(Zr)/[n(Ni)+n(Co)+n(Mn)+n(Al)]=0.025$. The aluminum oxide powder contained both nano-scale and submicron-scale particles, and had D50 of 3.8 μm, K90 of 2, and a specific surface area of 78 m²/g. The zirconium oxide powder contained both nano-scale and submicron-scale particles, and had D50 of 6 μm, K90 of 2.8, and a specific surface area of 34 m²/g.

(2) The mixed material was subjected to a sintering treatment at 600° C. in an oxygen atmosphere for 8 hours, to obtain a single crystal multi-element cathode material A5, including a matrix and a coating layer coated on the matrix. The matrix had a composition of $Li_{1.05}Ni_{0.54}Co_{0.18}Mn_{0.18}Al_{0.1}O_2$. The coating layer was mainly composed of lithium aluminum oxide and lithium zirconium oxide, and also contained a small amount of aluminum oxide and zirconium oxide. A molar ratio of the coating layer, based on [n(Al)+n(Zr)], to the matrix, based on [n(Ni)+n(Co)+n(Mn)+n(Al)], was 0.05. A molar ratio of aluminum oxide and lithium aluminum oxide in the coating layer, based on n(Al), to the matrix, based on [n(Ni)+n(Co)+n(Mn)+n(Al)] was 0.025. A molar ratio of zirconium oxide and lithium zirconium oxide in the coating layer, based on n(Zr), to the matrix, based on [n(Ni)+n(Co)+n(Mn)+n(Al)], was 0.025.

Example 6

A single crystal multi-element cathode material was prepared according to the method in Example 1. Example 6 differed from Example 1 in that P2 was used to replace P1. The single crystal multi-element cathode material A6 was prepared, including a matrix and a coating layer coated on the matrix. The matrix had a composition of $Li_{1.05}Ni_{0.8}Co_{0.1}Mn_{0.1}Zr_{0.002}O_2$. The coating layer was mainly composed of lithium cobalt oxide, and also contained a small amount of cobalt oxide. A molar ratio of the coating layer, based on n(Co), to the matrix, based on [n(Ni)+n(Co)+n(Mn)+n(Zr)], was 0.025.

Example 7

A single crystal multi-element cathode material was prepared according to the method in Example 1. Example 7 differed from Example 1 in that P3 was used to replace P1. The single crystal multi-element cathode material A7 was prepared, including a matrix and a coating layer coated on the matrix. The matrix had a composition of $Li_{1.03}Ni_{0.96}Co_{0.02}Al_{0.02}Ti_{0.001}O_2$. The coating layer was mainly composed of lithium cobalt oxide, and also contained a small amount of cobalt oxide. A molar ratio of the coating layer, based on n(Co), to the matrix, based on [n(Ni)+n(Co)+n(Al)+n(Ti)], was 0.025.

Example 8

A single crystal multi-element cathode material was prepared according to the method in Example 1. Example 8 differed from Example 1 in that P4 was used to replace P1. The single crystal multi-element cathode material A8 was prepared, including a matrix and a coating layer coated on the matrix. The matrix had a composition of $Li_{1.05}Ni_{0.6}Co_{0.2}Mn_{0.2}O_2$. The coating layer was mainly composed of lithium cobalt oxide, and also contained a small amount of cobalt oxide. A molar ratio of the coating layer, based on n(Co), to the matrix, based on [n(Ni)+n(Co)+n(Mn)], was 0.025.

Example 9

A single crystal multi-element cathode material was prepared according to the method in Example 1. Example 9 differed from Example 1 in that the multi-element cathode material and cobalt hydroxide were added according to a stoichiometric ratio of n(Co)/[n(Ni)+n(Co)+n(Mn)+n(Al)]

=0.001. The single crystal multi-element cathode material A9 was prepared, including a matrix and a coating layer coated on the matrix. The matrix had a composition of $Li_{1.05}Ni_{0.6}Co_{0.2}Mn_{0.2}O_2$. The coating layer was mainly composed of lithium cobalt oxide, and also contained a small amount of cobalt oxide. A molar ratio of the coating layer, based on n(Co), to the matrix, based on [n(Ni)+n(Co)+n(Mn)], was 0.001.

Example 10

A single crystal multi-element cathode material was prepared according to the method in Example 1. Example 10 differed from Example 1 in that the linear speed at the end of the stirring paddle was 10 m/s. The single crystal multi-element cathode material A10 was prepared, including a matrix and a coating layer coated on the matrix. The matrix had a composition of $Li_{1.05}Ni_{0.54}Co_{0.18}Mn_{0.18}Al_{0.1}O_2$. The coating layer was mainly composed of lithium cobalt oxide, and also contained a small amount of cobalt oxide. A molar ratio of the coating layer, based on n(Co), to the matrix, based on [n(Ni)+n(Co)+n(Mn)+n(Al)], was 0.025.

Example 11

A single crystal multi-element cathode material was prepared according to the method in Example 1. Example 11 differed from Example 1 in that the temperature of the sintering treatment was 400° C. The single crystal multi-element cathode material A11 was prepared, including a matrix and a coating layer coated on the matrix. The matrix had a composition of $Li_{1.05}Ni_{0.54}Co_{0.18}Mn_{0.18}Al_{0.1}O_2$. The coating layer was mainly composed of lithium cobalt oxide, and also contained a small amount of cobalt oxide. A molar ratio of the coating layer, based on n(Co), to the matrix, based on [n(Ni)+n(Co)+n(Mn)+n(Al)], was 0.025.

Example 12

A single crystal multi-element cathode material was prepared according to the method in Example 1. Example 12 differed from Example 1 in that the duration of the sintering treatment was 2 hours. The single crystal multi-element cathode material A12 was prepared, including a matrix and a coating layer coated on the matrix. The matrix had a composition of $Li_{1.05}Ni_{0.54}Co_{0.18}Mn_{0.18}Al_{0.1}O_2$. The coating layer was mainly composed of lithium cobalt oxide, and also contained a small amount of cobalt oxide. A molar ratio of the coating layer, based on n(Co), to the matrix, based on [n(Ni)+n(Co)+n(Mn)+n(Al)], was 0.025.

Comparative Example 1

A single crystal multi-element cathode material was prepared according to the method in Example 1. Comparative Example 1 differed from Example 1 in that the cobalt hydroxide powder only contained submicron-scale particles and had D50 of 14 μm, K90 of 1, and a specific surface area of 6 m²/g. The single crystal multi-element cathode material D1 was prepared, including a matrix and a coating layer coated on the matrix. The matrix had a composition of $Li_{1.05}Ni_{0.54}Co_{0.18}Mn_{0.18}Al_{0.1}O_2$. The coating layer was mainly composed of lithium cobalt oxide, and also contained a small amount of cobalt oxide. A molar ratio of the coating layer, based on n(Co), to the matrix, based on [n(Ni)+n(Co)+n(Mn)+n(Al)], was 0.025.

Comparative Example 2

A precursor of $Ni_{0.6}Co_{0.2}Mn_{0.2}(OH)_2$, a lithium source of $Li_2CO_3$ and LiOH, and the dopant containing Al compound were mixed according to a molar ratio of $n(Li)/[n(Ni)+n(Co)+n(Mn)+n(Al)]=1.05$ and $n(Al)/[n(Ni)+n(Co)+n(Mn)+n(Al)]=0.1$, and then the cobalt hydroxide powder was added according to a molar ratio of $n(Co)/[n(Ni)+n(Co)+n(Mn)+$ $n(Al)]=0.025$. The cobalt hydroxide powder contained both nano-scale and submicron-scale particles, and had D50 of 0.5 μm, K90 of 2.3, and a specific surface area of 20 m²/g. Then, the mixture was subjected to a heat treatment at 900° C. for 10 hours to prepare a multi-element cathode material D2, having a composition of $Li_{1.05}Ni_{0.53}Co_{0.2}Mn_{0.18}Al_{0.09}O_2$.

TABLE 2

|  |  | Example 1 | Example 2 | Example 3 | Example 4 | Example 5 | Example 6 | Example 7 |
|---|---|---|---|---|---|---|---|---|
| Positive electrode material |  | P1 | P1 | P1 | P1 | P1 | P2 | P3 |
| Grain boundary stabilizer | Type | Cobalt hydroxide | Tungsten oxide | Titanium boride | Aluminum oxide | Aluminum oxide + zirconium oxide | Cobalt hydroxide | Cobalt hydroxide |
|  | D50/μm | 0.5 | 4 | 1 | 3.8 | 3.8/6 | 0.5 | 0.5 |
|  | K90 | 2.3 | 3.4 | 5.6 | 2 | 2/2.8 | 2.3 | 2.3 |
|  | BET/m²/g | 20 | 14 | 45 | 78 | 78/34 | 20 | 20 |
| n(G)/[(Ni) + n(Co) + n(Me) + n(M)] |  | 0.025 | 0.025 | 0.025 | 0.025 | 0.025 | 0.025 | 0.025 |
| Linear speed/m/s |  | 35 | 35 | 35 | 35 | 35 | 35 | 35 |
| Temperature of sintering treatment/° C. |  | 750 | 750 | 750 | 750 | 750 | 750 | 750 |
| Duration of sintering treatment/h |  | 6 | 6 | 6 | 6 | 6 | 6 | 6 |

|  |  | Example 8 | Example 9 | Example 10 | Example 11 | Example 12 | Comparative Example 1 | Comparative Example 2 |
|---|---|---|---|---|---|---|---|---|
| Positive electrode material |  | P4 | P1 | P1 | P1 | P1 | P1 | P1 + cobalt hydroxide |
| Grain boundary stabilizer | Type | Cobalt hydroxide | Cobalt hydroxide | Cobalt hydroxide | Cobalt hydroxide | Cobalt hydroxide | Cobalt hydroxide | / |
|  | D50/μm | 0.5 | 0.5 | 0.5 | 0.5 | 0.5 | 14 | 0.5 |
|  | K90 | 2.3 | 2.3 | 2.3 | 2.3 | 2.3 | 1 | 2.3 |
|  | BET/m²/g | 20 | 20 | 20 | 20 | 20 | 6 | 20 |
| n(G)/[n(Ni) + n(Co) + n(Me) + n(M)] |  | 0.025 | 0.001 | 0.025 | 0.025 | 0.025 | 0.025 | 0.025 |
| Linear speed/m/s |  | 35 | 35 | 10 | 35 | 35 | 35 | / |
| Temperature of sintering treatment/° C. |  | 750 | 750 | 750 | 400 | 750 | 750 |  |
| Duration of sintering treatment/h |  | 6 | 6 | 6 | 6 | 2 | 6 | / |

For the multi-element cathode materials of the preparation examples, examples, and comparative examples, the concentrations $C_1$, $C_g$, and $C_2$ (mol %) of the element G at different sites were tested, and the results were shown in Table 3.

It should be noted that in Table 3, when calculating the proportion of data satisfying Formula II, the standard related to the content of the element G was adopted. Specifically, when $C_1>5\%$, k ranges from 0.9 to 1.1; and when $C_1 \leq 5\%$, k ranges from 0.8 to 1.2.

TABLE 3

| Site | $\frac{L/2 - L_g}{L/2}$ | $C_2 + \frac{L/2 - L_g}{L/2}(C_1 - C_2)$ | Preparation Example 1 | Example 1 | Comparative Example 1 | Comparative Example 2 | Example 8 |
|---|---|---|---|---|---|---|---|
|  |  |  |  | Element Co |  |  |  |
| Concentration $C_1$ of surface of particles | / | / | 20 | 25 | 25 | 23 | 25 |
| Concentration $C_2$ of bulk phase of particles | / | / | 20 | 20 | 20 | 23 | 20 |
| 1-site | 1 | 25 | 20.3 | 25.4 | 28.0 | 23.1 | 25.3 |
| 2-site | 0.75 | 23.75 | 21.1 | 23.4 | 24.8 | 21.9 | 23.7 |
| 3-site | 0.5 | 22.5 | 20.2 | 23 | 20.1 | 22.2 | 22.4 |
| 4-site | 0.25 | 21.25 | 19.0 | 21.3 | 21.0 | 21.9 | 21.8 |
| 5-site | 0 | 20 | 20.2 | 20.9 | 20.2 | 23.3 | 19.6 |
| 6-site | 0.25 | 21.25 | 20.2 | 22.1 | 21.4 | 24.0 | 20.1 |
| 7-site | 0.5 | 22.5 | 19.7 | 24.2 | 20.6 | 23.3 | 22.6 |

TABLE 3-continued

| | | | | | | | |
|---|---|---|---|---|---|---|---|
| 8-site | 0.75 | 23.75 | 20.5 | 23.9 | 26.3 | 23.1 | 24.3 |
| 9-site | 1 | 25 | 20.1 | 25.3 | 27.9 | 22.3 | 26.1 |
| Concentration gradient? | / | / | No | Yes | No | No | Yes |
| Proportion of data satisfying Formula II | / | / | / | 100% | 56% | / | 100% |

| Site | $\dfrac{L/2 - L_g}{L/2}$ | $C_2 + \dfrac{L/2 - L_g}{L/2}(C_1 - C_2)$ | Example 9<br>Element<br>Co |
|---|---|---|---|
| Concentration $C_1$ of surface of particles | / | / | 20.5 |
| Concentration $C_2$ of bulk phase of particles | / | / | 20 |
| 1-site | 1 | 20.5 | 20.6 |
| 2-site | 0.75 | 20.4 | 20.6 |
| 3-site | 0.5 | 20.3 | 20.5 |
| 4-site | 0.25 | 20.1 | 20.0 |
| 5-site | 0 | 20.0 | 19.8 |
| 6-site | 0.25 | 20.1 | 20.0 |
| 7-site | 0.5 | 20.3 | 20.2 |
| 8-site | 0.75 | 20.4 | 20.5 |
| 9-site | 1 | 20.5 | 20.8 |
| Concentration gradient? | / | / | Yes |
| Proportion of data satisfying Formula II | / | / | 100% |

| Site | $\dfrac{L/2 - L_g}{L/2}$ | $C_2 + \dfrac{L/2 - L_g}{L/2}(C_1 - C_2)$ | Example 10 | Example 11 | Example 12 |
|---|---|---|---|---|---|
| | | | Element Co | | |
| Concentration $C_1$ of surface of particles | / | / | 25 | 25 | 25 |
| Concentration $C_2$ of bulk phase of particles | / | / | 20 | 20 | 20 |
| 1-site | 1 | 25 | 26 | 26.8 | 27.8 |
| 2-site | 0.75 | 23.75 | 20.9 | 26.3 | 24.7 |
| 3-site | 0.5 | 22.5 | 21.5 | 22.8 | 21.6 |
| 4-site | 0.25 | 21.25 | 20.9 | 21 | 20.7 |
| 5-site | 0 | 20 | 20.7 | 20.9 | 20.4 |
| 6-site | 0.25 | 21.25 | 21.2 | 20.8 | 20.8 |
| 7-site | 0.5 | 22.5 | 20.1 | 24.1 | 20.2 |
| 8-site | 0.75 | 23.75 | 22.4 | 25.5 | 25.6 |
| 9-site | 1 | 25 | 26.8 | 26.3 | 26.6 |
| Concentration gradient? | / | / | Yes | Yes | Yes |
| Proportion of data satisfying Formula II | / | / | 78% | 89% | 89% |

| Site | $\dfrac{L/2 - L_g}{L/2}$ | $C_2 + \dfrac{L/2 - L_g}{L/2}(C_1 - C_2)$ | Preparation Example 1 | Example 2 |
|---|---|---|---|---|
| | | | Element W | |
| Concentration $C_1$ of surface of particles | / | / | 0 | 5 |
| Concentration $C_2$ of bulk phase of particles | / | / | 0 | 0 |
| 1-site | 1 | 5 | 0.3 | 5.5 |
| 2-site | 0.75 | 3.75 | 1.1 | 4.3 |
| 3-site | 0.5 | 2.5 | 0.6 | 2.4 |
| 4-site | 0.25 | 1.25 | 0.1 | 1.4 |
| 5-site | 0 | 0 | 0.2 | 0.4 |
| 6-site | 0.25 | 1.25 | 0.2 | 1.8 |
| 7-site | 0.5 | 2.5 | 0.3 | 2.8 |
| 8-site | 0.75 | 3.75 | 0.5 | 3.1 |
| 9-site | 1 | 5 | 0.1 | 5.1 |
| Concentration gradient? | / | / | No | Yes |
| Proportion of data satisfying Formula II | / | / | / | 89% |

TABLE 3-continued

| Site | $\dfrac{L/2 - L_g}{L/2}$ | $C_2 + \dfrac{L/2 - L_g}{L/2}(C_1 - C_2)$ | Preparation Example 1 Element Ti | Example 3 |
|---|---|---|---|---|
| Concentration $C_1$ of surface of particles | / | / | 0 | 5 |
| Concentration $C_2$ of bulk phase of particles | / | / | 0 | 0 |
| 1-site | 1 | 5 | 0.2 | 5.5 |
| 2-site | 0.75 | 3.75 | 0.2 | 3.25 |
| 3-site | 0.5 | 2.5 | 0.1 | 2.25 |
| 4-site | 0.25 | 1.25 | 0.5 | 0.75 |
| 5-site | 0 | 0 | 0.3 | 1.25 |
| 6-site | 0.25 | 1.25 | 0.2 | 1.5 |
| 7-site | 0.5 | 2.5 | 0.1 | 2.75 |
| 8-site | 0.75 | 3.75 | 0.2 | 4.25 |
| 9-site | 1 | 5 | 0.4 | 4.75 |
| Concentration gradient? | / | / | No | Yes |
| Proportion of data satisfying Formula II | / | / | / | 78% |

| Site | $\dfrac{L/2 - L_g}{L/2}$ | $C_2 + \dfrac{L/2 - L_g}{L/2}(C_1 - C_2)$ | Preparation Example 1 Element Al | Example 4 |
|---|---|---|---|---|
| Concentration $C_1$ of surface of particles | / | / | 10 | 15 |
| Concentration $C_2$ of bulk phase of particles | / | / | 10 | 10 |
| 1-site | 1 | 15 | 9.9 | 15.4 |
| 2-site | 0.75 | 13.75 | 10.1 | 13.4 |
| 3-site | 0.5 | 12.5 | 10.2 | 13 |
| 4-site | 0.25 | 11.25 | 9.9 | 11.3 |
| 5-site | 0 | 10 | 10.0 | 10.9 |
| 6-site | 0.25 | 11.25 | 9.8 | 12.1 |
| 7-site | 0.5 | 12.5 | 10.3 | 14.2 |
| 8-site | 0.75 | 13.75 | 10.2 | 13.9 |
| 9-site | 1 | 15 | 10.0 | 15.3 |
| Concentration gradient? | / | / | No | Yes |
| Proportion of data satisfying Formula II | / | / | / | 100% |

| Site | $\dfrac{L/2 - L_g}{L/2}$ | $C_2 + \dfrac{L/2 - L_g}{L/2}(C_1 - C_2)$ | Preparation Example 1 Element Al | Example 5 | $C_2 + \dfrac{L/2 - L_g}{L/2}(C_1 - C_2)$ | Preparation Example 1 Element Zr | Example 5 |
|---|---|---|---|---|---|---|---|
| $C_1$ of surface of particles | / | / | 10 | 15 | / | 0 | 5 |
| $C_2$ of bulk phase of particles | / | / | 10 | 10 | / | 0 | 0 |
| 1-site | 1 | 15 | 10.1 | 14.8 | 5 | 0.2 | 4.9 |
| 2-site | 0.75 | 13.75 | 10.3 | 14.1 | 3.75 | 0.1 | 3.9 |
| 3-site | 0.5 | 12.5 | 10.1 | 12.9 | 2.5 | 0.2 | 2.6 |
| 4-site | 0.25 | 11.25 | 9.8 | 11.0 | 1.25 | 0.0 | 1.4 |
| 5-site | 0 | 10 | 10.2 | 10.6 | 0 | 0.1 | 0.8 |
| 6-site | 0.25 | 11.25 | 10.2 | 10.9 | 1.25 | 0.4 | 0.7 |
| 7-site | 0.5 | 12.5 | 10.5 | 13.1 | 2.5 | 0.1 | 2.3 |
| 8-site | 0.75 | 13.75 | 9.9 | 13.6 | 3.75 | 0.2 | 3.8 |
| 9-site | 1 | 15 | 10.1 | 15.2 | 5 | 0.0 | 5.1 |
| Concentration gradient? | / | / | No | Yes | / | No | Yes |
| Proportion of data satisfying Formula II | / | / | / | 100% | / | / | 78% |

TABLE 3-continued

| Site | $\dfrac{L/2 - L_g}{L/2}$ | $C_2 + \dfrac{L/2 - L_g}{L/2}(C_1 - C_2)$ | Preparation Example 2<br>Element Co | Example 6 |
|---|---|---|---|---|
| Concentration $C_1$ of surface of particles | / | / | 10 | 15 |
| Concentration $C_2$ of bulk phase of particles | / | / | 10 | 10 |
| 1-site | 1 | 15 | 10.3 | 15.1 |
| 2-site | 0.75 | 13.75 | 11.1 | 13.6 |
| 3-site | 0.5 | 12.5 | 10.6 | 12.2 |
| 4-site | 0.25 | 11.25 | 9.9 | 11.0 |
| 5-site | 0 | 10 | 10.2 | 10.1 |
| 6-site | 0.25 | 11.25 | 10.2 | 11.7 |
| 7-site | 0.5 | 12.5 | 9.7 | 12.8 |
| 8-site | 0.75 | 13.75 | 10.5 | 13.3 |
| 9-site | 1 | 15 | 10.1 | 14.9 |
| Concentration gradient? | / | / | No | Yes |
| Proportion of data satisfying Formula II | / | / | / | 100% |

| Site | $\dfrac{L/2 - L_g}{L/2}$ | $C_2 + \dfrac{L/2 - L_g}{L/2}(C_1 - C_2)$ | Preparation Example 3<br>Element Co | Example 7 |
|---|---|---|---|---|
| Concentration $C_1$ of surface of particles | / | / | 2 | 7 |
| Concentration $C_2$ of bulk phase of particles | / | / | 2 | 2 |
| 1-site | 1 | 7 | 2.1 | 6.8 |
| 2-site | 0.75 | 5.75 | 2.2 | 5.7 |
| 3-site | 0.5 | 4.5 | 2.1 | 4.4 |
| 4-site | 0.25 | 3.25 | 2.0 | 3.0 |
| 5-site | 0 | 2 | 2.0 | 2.5 |
| 6-site | 0.25 | 3.25 | 2.0 | 3.1 |
| 7-site | 0.5 | 4.5 | 1.9 | 4.7 |
| 8-site | 0.75 | 5.75 | 2.1 | 5.8 |
| 9-site | 1 | 7 | 2.0 | 7.1 |
| Concentration gradient? | / | / | No | Yes |
| Proportion of data satisfying Formula II | / | / | / | 89% |

Table 4 shows values of coefficient k calculated according to Formula II at various sites in the examples and comparative examples.

It should be noted that in Table 4, when calculating the proportion of data satisfying Formula II, the standard related to the content of the element G was adopted. Specifically, when $C_1 > 5\%$, k ranges from 0.9 to 1.1; and when $C_1 \leq 5\%$, k ranges from 0.8 to 1.2.

TABLE 4

| Site | Preparation Example 1 | Example 1 | Comparative Example 1 | Comparative Example 2 | Example 8 |
|---|---|---|---|---|---|
| | | | k (element Co) | | |
| 1-site | 0.81 | 1.02 | 1.12 | 0.92 | 1.01 |
| 2-site | 0.89 | 0.99 | 1.04 | 0.92 | 1 |
| 3-site | 0.90 | 1.02 | 0.89 | 0.99 | 1 |
| 4-site | 0.89 | 1.00 | 0.99 | 1.03 | 1.03 |
| 5-site | 1.01 | 1.05 | 1.01 | 1.17 | 0.98 |
| 6-site | 0.95 | 1.04 | 1.01 | 1.13 | 0.95 |

TABLE 4-continued

| | | | | | |
|---|---|---|---|---|---|
| 7-site | 0.88 | 1.08 | 0.92 | 1.04 | 1 |
| 8-site | 0.86 | 1.01 | 1.11 | 0.97 | 1.02 |
| 9-site | 0.80 | 1.01 | 1.12 | 0.89 | 1.04 |
| Concentration gradient? | No | Yes | No | No | Yes |
| Proportion of data satisfying Formula II | / | 100% | 56% | / | 100% |

| Site | Example 9 | Example 10 | Example 11 | Example 12 |
|---|---|---|---|---|
| | | k (element Co) | | |
| 1-site | 1 | 1.04 | 1.07 | 1.11 |
| 2-site | 1.01 | 0.88 | 1.11 | 1.04 |
| 3-site | 1.01 | 0.96 | 1.01 | 0.96 |
| 4-site | 1 | 0.98 | 0.99 | 0.97 |
| 5-site | 0.99 | 1.04 | 1.05 | 1.02 |
| 6-site | 1 | 1 | 0.98 | 0.98 |
| 7-site | 1 | 0.89 | 1.07 | 0.90 |
| 8-site | 1 | 0.94 | 1.07 | 1.08 |
| 9-site | 1.01 | 1.07 | 1.05 | 1.06 |
| Concentration gradient? | Yes | Yes | Yes | Yes |
| Proportion of data satisfying Formula II | 100% | 78% | 89% | 89% |

| Site | Preparation Example 1 | Example 2 |
|---|---|---|
| | k (element W) | |
| 1-site | 0.06 | 1.10 |
| 2-site | 0.29 | 1.15 |
| 3-site | 0.24 | 0.96 |
| 4-site | 0.08 | 1.12 |
| 5-site | / | / |
| 6-site | 0.16 | 1.44 |
| 7-site | 0.12 | 1.12 |
| 8-site | 0.13 | 0.83 |
| 9-site | 0.02 | 1.02 |
| Concentration gradient? | No | Yes |
| Proportion of data satisfying Formula II | / | 89% |

| Site | Preparation Example 1 | Example 3 |
|---|---|---|
| | k (element Ti) | |
| 1 | 0.04 | 1.10 |
| 2 | 0.05 | 0.87 |
| 3 | 0.04 | 0.90 |
| 4 | 0.40 | 0.60 |
| 5 | / | / |
| 6 | 0.16 | 1.20 |
| 7 | 0.04 | 1.10 |
| 8 | 0.05 | 1.13 |
| 9 | 0.08 | 0.95 |
| Concentration gradient? | No | Yes |
| Proportion of data satisfying Formula II | / | 78% |

| Site | Preparation Example 1 | Example 4 |
|---|---|---|
| | k (element Al) | |
| 1 | 0.66 | 1.03 |
| 2 | 0.73 | 0.97 |
| 3 | 0.82 | 1.04 |
| 4 | 0.88 | 1.00 |
| 5 | 1.00 | 1.09 |
| 6 | 0.87 | 1.08 |
| 7 | 0.82 | 1.14 |
| 8 | 0.74 | 1.01 |
| 9 | 0.67 | 1.02 |
| Concentration gradient? | No | Yes |
| Proportion of data satisfying Formula II | / | 100% |

| Site | Preparation Example 1 | Example 5 | Preparation Example 1 | Example 5 |
|---|---|---|---|---|
| | k (element Al) | | k (element Zr) | |
| 1 | 0.67 | 0.99 | 0.04 | 0.98 |
| 2 | 0.75 | 1.03 | 0.03 | 1.04 |
| 3 | 0.81 | 1.03 | 0.08 | 1.04 |
| 4 | 0.87 | 0.98 | | 1.12 |
| 5 | 1.02 | 1.06 | / | / |

TABLE 4-continued

| | | | | |
|---|---|---|---|---|
| 6 | 0.91 | 0.97 | 0.32 | 0.56 |
| 7 | 0.84 | 1.05 | 0.04 | 0.92 |
| 8 | 0.72 | 0.99 | 0.05 | 1.01 |
| 9 | 0.67 | 1.01 | | 1.02 |
| Concentration gradient? | No | Yes | No | Yes |
| Proportion of data satisfying Formula II | / | 100% | / | 78% |

| Site | Preparation Example 2 k (element Co) | Example 6 |
|---|---|---|
| 1 | 0.69 | 1.01 |
| 2 | 0.81 | 0.99 |
| 3 | 0.85 | 0.98 |
| 4 | 0.88 | 0.98 |
| 5 | 1.02 | 1.01 |
| 6 | 0.91 | 1.04 |
| 7 | 0.78 | 1.02 |
| 8 | 0.76 | 0.97 |
| 9 | 0.67 | 0.99 |
| Concentration gradient? | No | Yes |
| Proportion of data satisfying Formula II | / | 100% |

| Site | Preparation Example 3 k (element Co) | Example 7 |
|---|---|---|
| 1-site | 0.30 | 0.97 |
| 2-site | 0.38 | 0.99 |
| 3-site | 0.47 | 0.98 |
| 4-site | 0.62 | 0.92 |
| 5-site | 1.00 | 1.25 |
| 6-site | 0.62 | 0.95 |
| 7-site | 0.42 | 1.04 |
| 8-site | 0.37 | 1.01 |
| 9-site | 0.29 | 1.01 |
| Concentration gradient? | No | Yes |
| Proportion of data satisfying Formula II | / | 89% |

Figure 2:
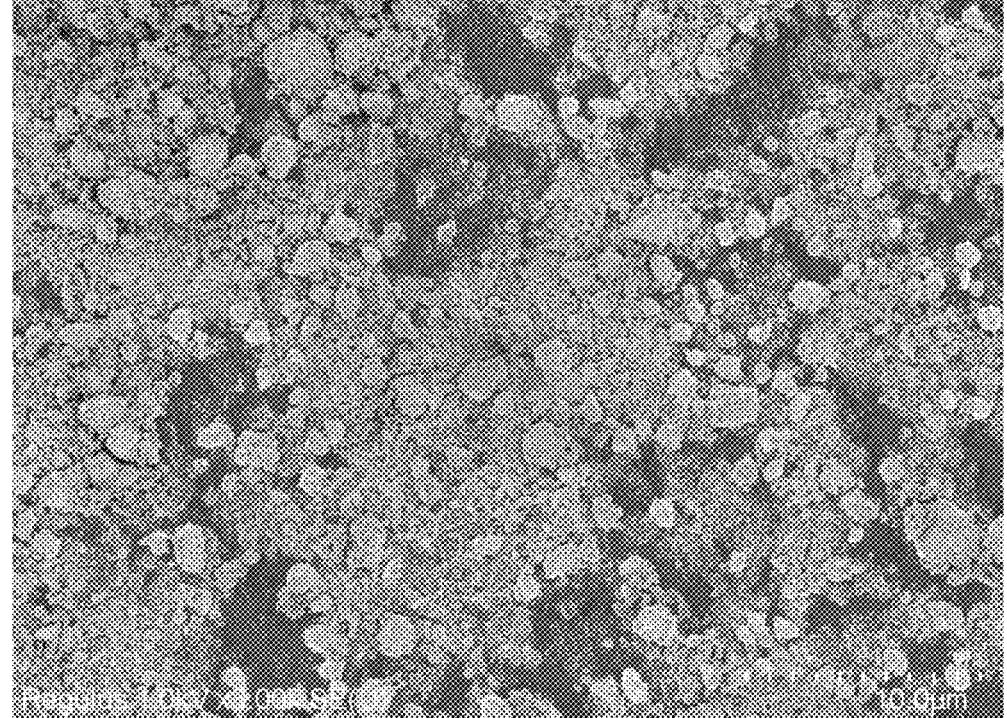
FIG. 2 is a schematic image of a grain boundary stabilizer cobalt hydroxide used in Example 1 containing micron and submicron ions.
Figure 3:
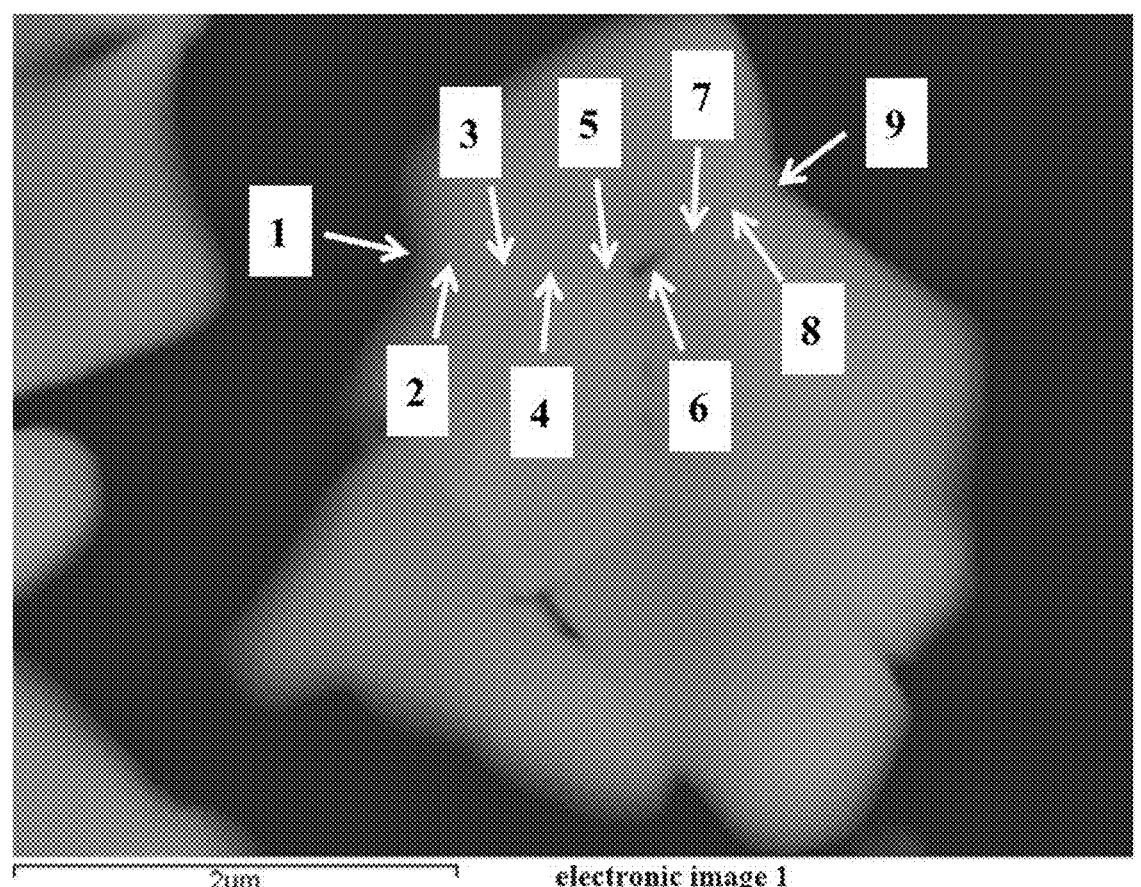
FIG. 3 is a schematic cross-sectional view of a single crystal multi-element cathode material prepared in Example 1, in which the numbers are examples of test sites of a concentration of an element at grain boundaries.

FIG. 2 is a schematic image of a grain boundary stabilizer cobalt hydroxide containing micron and submicron ions. It can be seen from FIG. 2 that the particle size distribution of the grain boundary stabilizer is relatively wide, and that the difference between large and small particles is obvious. FIG. 3 is a schematic cross-sectional view of the single crystal multi-element cathode material prepared in Example 1, in which numbers are examples of test sites of the concentration of the element within grain boundaries.

The cathode materials prepared in the preparation examples, the examples, and the comparative examples were assembled into lithium-ion batteries, and the electrochemical performance of the lithium-ion batteries was tested. The results were shown in the following table.

TABLE 5

| | First-cycle discharge specific capacity (0.1 C/mAh/g) | Discharge specific capacity (1 C/mAh/g) | Rate capability (1 C/0.1 C) | Capacity retention rate after 80 cycles at 45° C./% | Impedance increase rate//% |
|---|---|---|---|---|---|
| Preparation Example 1 | 178.2 | 160.7 | 90.2 | 90.4 | 163 |
| Preparation Example 2 | 203.3 | 178.5 | 87.8 | 86.1 | 187 |
| Preparation Example 3 | 216.2 | 184.6 | 85.4 | 81.6 | 203 |
| Preparation Example 4 | 180.3 | 165.2 | 91.6 | 89.7 | 177 |
| Example 1 | 184.5 | 172.1 | 93.3 | 96.4 | 118 |
| Example 2 | 183.3 | 170.3 | 92.9 | 95.7 | 113 |
| Example 3 | 182.7 | 169.0 | 92.5 | 96.9 | 134 |
| Example 4 | 183.1 | 169.6 | 92.6 | 96.6 | 131 |
| Example 5 | 182.3 | 168.3 | 92.3 | 97.7 | 127 |
| Example 6 | 206.6 | 186.8 | 90.4 | 92.1 | 132 |
| Example 7 | 219.3 | 194.5 | 88.7 | 88.5 | 161 |
| Example 8 | 182.9 | 170.3 | 93.1 | 96.1 | 125 |
| Example 9 | 181.8 | 166.9 | 91.8 | 95.7 | 134 |
| Example 10 | 180.1 | 167.3 | 92.9 | 95.1 | 138 |

TABLE 5-continued

| | First-cycle discharge specific capacity (0.1 C/mAh/g) | Discharge specific capacity (1 C/mAh/g) | Rate capability (1 C/0.1 C) | Capacity retention rate after 80 cycles at 45° C./% | Impedance increase rate//% |
|---|---|---|---|---|---|
| Example 11 | 181.5 | 168.8 | 93.0 | 95.4 | 133 |
| Example 12 | 179.8 | 166.5 | 92.6 | 94.9 | 148 |
| Comparative Example 1 | 178.1 | 160.1 | 89.9 | 90.6 | 159 |
| Comparative Example 2 | 177.8 | 160.2 | 90.1 | 90.5 | 166 |

It can be seen from Table 3, Table 4, and Table 5 that compared with Preparation Example 1 and Comparative Example 1 to Comparative Example 2, the cathode materials prepared in Example 1 to Example 12 of the present disclosure all contain interface stabilizer elements, and the concentration of the element G at the g-site of the grain boundaries gradually decreases with the increase in the distance between the g-site and the surface of the quasi single crystal particles. When the above-mentioned cathode material is used in the lithium-ion batteries, the first-cycle discharge capacity, rate capability, and cycle performance of the lithium-ion batteries can be significantly improved and enhanced, and the impedance increase rate can be reduced.

Further, compared with Example 9 to Example 12, the concentration gradient of the grain boundary stabilizer in the grain boundaries of the cathode materials prepared in Examples 1 to Example 8 is more significant. In Examples 9 to Example 12, the uniformity of the gradient distribution is slightly worse, the concentration of the material is higher at the surface, the concentration difference close to the interior of the particles is smaller, and some data exceed the calculation range of Formula II. When the cathode materials prepared in Example 1 to Example 8 are used in the lithium-ion batteries, the lithium-ion batteries can have high first-cycle discharge specific capacity, rate capability, and cycle performance, lower impedance increase rate, and optimal overall performance, simultaneously.

Further, Example 2 to Example 4 provide cathode materials prepared by different types of grain boundary stabilizers, all of which have a good concentration gradient filling effect at the grain boundary. When the above-mentioned cathode materials are used in the lithium-ion batteries, the first-cycle discharge capacity, rate capability, cycle performance, and impedance increase rate of the lithium-ion batteries can be improved and enhanced.

Further, Example 5 provides cathode materials prepared by two different types of grain boundary stabilizers. It can be seen that both stabilizers have a concentration gradient filling effect. However, due to the great total addition amount of the grain boundary stabilizers, when the cathode materials are used in the lithium-ion batteries, the capacity of the battery decreases slightly, but the cycle performance is relatively better.

Further, it can be seen from Example 6 and Example 7 that the same effect may be obtained for different NCM compositions. In Example 7, due to the overall lower concentration, the calculation range of Formula II is narrower. In addition, limited by the test stability, the sites that meet the calculation range account for 89%, but this does not affect the determination of the gradient concentration effect. When the cathode materials are used in the lithium-ion batteries, the improvement of this effect on the various performance of the battery is improved.

Further, it can be seen from Example 8 that the improvement effect of the concentration gradient filling of the grain boundary stabilizer at the grain boundary is not affected by whether the cathode material is doped or not.

Figure 4:
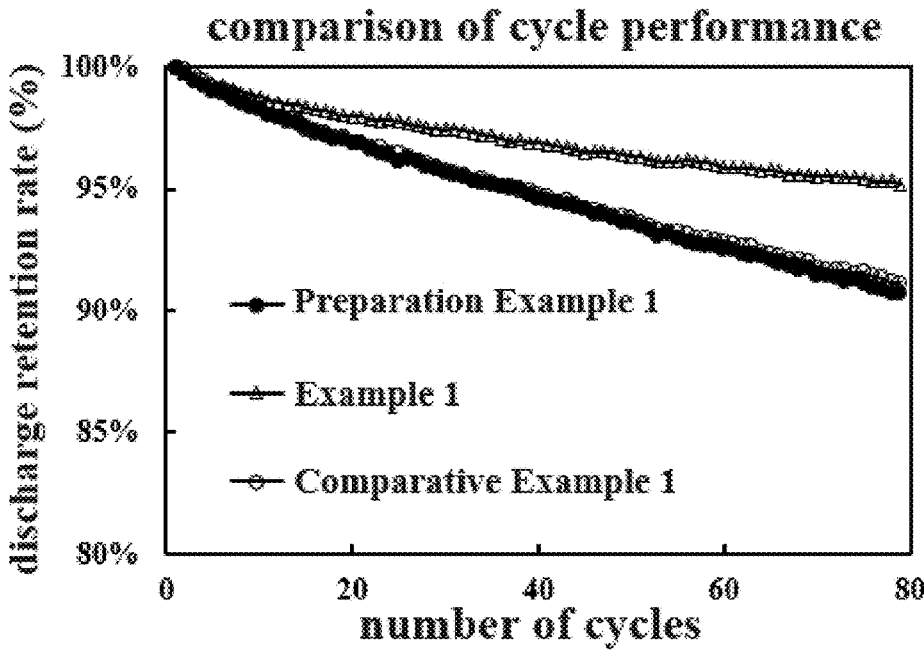
FIG. 4 is a comparison graph of cycle performance at a 1 C rate of cathode materials prepared in Preparation Example 1, Example 1, and Comparative Example 1, a test temperature being 45° C. and a voltage range ranging from 3.0V to 4.3V.

In the cathode material prepared in Comparative Example 1, since the grain boundary stabilizer only contains micron-sized particles, the particle size distribution is relatively narrow, the overall reaction activity is low, and the main element of the grain boundary stabilizer is enriched on the outer surface of the quasi single crystal particles and cannot smoothly diffuse into the grain boundaries, that is, the filling effect of the concentration gradient within the grain boundaries is not achieved. When used in the lithium-ion batteries, the overall performance is close to that of Preparation Example 1, and cannot reach the performance level of Example 1. FIG. 4 is a comparison graph of cycle performance at a 1 C rate of the cathode materials prepared in Preparation Example 1, Example 1, and Comparative Example 1. It can be seen from FIG. 4 that there is a significant performance gap therebetween.

The cathode material of Comparative Example 2 is prepared by adding the grain boundary stabilizer during the mixing process of the precursor and the lithium salt for sintering. The results indicate that there is no concentration difference between the surface and the bulk phase, and that there is no concentration gradient distribution effect at the grain boundary. When the cathode material is used in a lithium-ion battery, the performance of the battery is not significantly improved compared with Preparation Example 1.

The preferred embodiments of the present disclosure are described in detail above. However, the present disclosure is not limited thereto. Within the scope of technical conception of the present disclosure, a variety of simple variations may be made to the technical solutions of the present disclosure, including the combination of various technical features in any other suitable manner. These simple variations and combinations shall be regarded as the contents disclosed by the present disclosure, and all of them fall within the scope of protection of the present disclosure.

What is claimed is:

1. A single crystal multi-element cathode material, comprising quasi single crystal particles each consisting of a plurality of crystal grains, element G being present at grain boundaries between the plurality of crystal grains, wherein:

a concentration of the element G at a g-site of the grain boundaries gradually decreases with an increase in a distance between the g-site and a surface of the quasi single crystal particles; and the element G is selected from at least one of Ni, Co, Mn, Ta, Cr, Mo, W, La, Al, Y, Ti, Zr, V, Nb, Ce, Er, and B, the single crystal multi-element cathode material comprises a matrix and a coating layer coated on the matrix, wherein:

the matrix has a composition represented by Formula III:

$$Li_{1+a}(Ni_xCo_yMe_zM_w)O_2,$$ Formula III, where: $-0.1 \leq a \leq 0.1$, $0 < x < 1$, $0 < y \leq 0.4$, $0 < z \leq 0.6$, $0 \leq w \leq 0.2$; Me is selected from Mn and/or Al; and M is at least one element of Ta, Cr, Mo, W, La, Al, Y, Ti, Zr, V, Nb, Ce, Er, Mg, Sr, and Ba; and the coating layer is selected from a lithium oxide compound of the element G and/or oxide of the element G; a molar ratio of the coating layer, based on n (G), to the matrix, based on [n(Ni)+n(Co)+n(Me)+n M)], ranges from 0.001 to 0.05.

2. The single crystal multi-element cathode material according to claim 1, wherein in a scanning electron microscope, SEM, image of a cross-section sample of the quasi single crystal particles, a concentration of the element G at the g-site of the grain boundaries satisfies the following relationship:

$$1.2C_1 \geq C_g \geq 0.8C_2, \text{ and}$$ Formula I, $$k = C_g \Big/ \left( C_2 + \frac{L/2 - L_g}{L/2}(C_1 - C_2) \right),$$ Formula II, where:
  $C_1$ is a concentration of the element G on the surface of the quasi single crystal particles, mol %;
  $C_2$ is a concentration of the element G in bulk phase of the quasi single crystal particles, mol %;
  $C_g$ is the concentration of the element G at the g-site of the grain boundaries, mol %;
  L is a total length of the grain boundary passing through the g-site, µm;
  $L_g$ is a length of the shortest path from the g-site to the surface of the quasi single crystal particles along the grain boundary, µm; and
  k is a coefficient, k ranging from 0.8 to 1.2.

3. The single crystal multi-element cathode material according to claim 2, wherein $1.1C_1 \geq C_g \geq 0.9C_2$.

4. The single crystal multi-element cathode material according to claim 2, wherein the total length L of the grain boundaries obtained by scanning electron microscope energy spectrum analysis satisfies $0.01 \ \mu m \leq L \leq 8 \ \mu m$.

5. The single crystal multi-element cathode material according to claim 4, wherein $C_1$-$C_2 \geq 0.2\%$.

6. The single crystal multi-element cathode material according to claim 4, wherein:
  when $C_1 > 5\%$, k ranges from 0.9 to 1.1; and
  when $C_1 \leq 5\%$, k ranges from 0.8 to 1.2.

7. The single crystal multi-element cathode material according to claim 1, wherein:
  the quasi single crystal particles have each a long diameter $D_1$ satisfying $0.1 \ \mu m \leq D_1 \leq 20 \ \mu m$ and a short diameter $D_2$ satisfying $0.1 \ \mu m \leq D_2 \leq 20 \ \mu m$.

8. The single crystal multi-element cathode material according to claim 7, wherein the grain boundaries each have a width ranging from 1 nm to 50 nm, and a difference between a maximum width of the grain boundaries and a minimum width of the grain boundaries is smaller than or equal to 20 nm.

9. A preparation method of the single crystal multi-element cathode material according to claim 1, the preparation method comprising:
  mixing the matrix with a grain boundary stabilizer containing the element G; and performing a sintering treatment on the mixture, to obtain the single crystal multi-element cathode material, wherein:

D50 of the grain boundary stabilizer ranges from 0.01 µm to 10 µm, and D10, D50, and D90 of the grain boundary stabilizer satisfy: K90=(D90-D10)/D50≥1.5.

10. The preparation method according to claim 9, wherein:
  the grain boundary stabilizer is added in an amount according to a stoichiometric ratio of $0.001 \leq n(G)/[n(Ni)+n(Co)+n(Me)+n(M)] \leq 0.05$.

11. The preparation method according to claim 10, wherein:
  conditions for said mixing comprise: mixing in a device comprising a stirring paddle, the stirring paddle having a linear speed at an end of the stirring paddle of greater than or equal to 20 m/s; and
  conditions for the sintering treatment comprise: a sintering temperature of 400° C. or higher, and a sintering duration of 4 hours or more.

12. A lithium-ion battery, comprising a single crystal multi-element cathode material, wherein the single crystal multi-element cathode material comprises quasi single crystal particles each consisting of a plurality of crystal grains, element G being present at grain boundaries between the plurality of crystal grains, wherein:
  a concentration of the element G at a g-site of the grain boundaries gradually decreases with an increase in a distance between the g-site and a surface of the quasi single crystal particles; and
  the element G is selected from at least one of Ni, Co, Mn, Ta, Cr, Mo, W, La, Al, Y, Ti, Zr, V, Nb, Ce, Er, and B,
  the single crystal multi-element cathode material comprises a matrix and a coating layer coated on the matrix, wherein:
  the matrix has a composition represented by Formula III:

$$Li_{1+a}(Ni_xCo_yMe_zM_w)O_2,$$ Formula III, where: $-0.1 \leq a \leq 0.1$, $0 < x < 1$, $0 < y \leq 0.4$, $0 < z \leq 0.6$, $0 \leq w \leq 0.2$; Me is selected from Mn and/or Al; and M is at least one element of Ta, Cr, Mo, W, La, Al, Y, Ti, Zr, V, Nb, Ce, Er, Mg, Sr, and Ba; and
  the coating layer is selected from a lithium oxide compound of the element G and/or oxide of the element G; a molar ratio of the coating layer, based on n (G), to the matrix, based on [n(Ni)+n(Co)+n(Me)+n(M)], ranges from 0.001 to 0.05.

13. The lithium-ion battery according to claim 12, wherein in a scanning electron microscope, SEM, image of a cross-section sample of the quasi single crystal particles, the concentration of the element G at the g-site of the grain boundaries satisfies the following relationship:

$$1.2C_1 \geq C_g \geq 0.8C_2, \text{ and}$$ Formula I, $$k = C_g \Big/ \left( C_2 + \frac{L/2 - L_g}{L/2}(C_1 - C_2) \right),$$ Formula II, where:
  $C_1$ is a concentration of the element G on the surface of the quasi single crystal particles, mol %;
  $C_2$ is a concentration of the element G in bulk phase of the quasi single crystal particles, mol %;
  $C_g$ is the concentration of the element G at the g-site of the grain boundaries, mol %;

L is a total length of the grain boundary passing through the g-site, μm;

$L_g$ is a length of the shortest path from the g-site to the surface of the quasi single crystal particles along the grain boundary, μm; and k is a coefficient, k ranging from 0.8 to 1.2; quasi single crystal.

* * * * *